(12) United States Patent
Selwyn

(10) Patent No.: US 8,800,485 B2
(45) Date of Patent: Aug. 12, 2014

(54) LARGE AREA, ATMOSPHERIC PRESSURE PLASMA FOR DOWNSTREAM PROCESSING

(71) Applicant: Gary S. Selwyn, Santa Fe, NM (US)

(72) Inventor: Gary S. Selwyn, Santa Fe, NM (US)

(73) Assignee: Apjet, Inc., Raleigh, NC (US)

( * ) Notice: Subject to any disclaimer, the term of this patent is extended or adjusted under 35 U.S.C. 154(b) by 0 days.

(21) Appl. No.: 13/752,001

(22) Filed: Jan. 28, 2013

(65) Prior Publication Data

US 2013/0134878 A1 May 30, 2013

Related U.S. Application Data

(62) Division of application No. 12/029,386, filed on Feb. 11, 2008, now Pat. No. 8,361,276.

(51) Int. Cl.
*C23C 16/00* (2006.01)
*H01L 21/00* (2006.01)

(52) U.S. Cl.
USPC .................. 118/723 E; 118/723 ER

(58) Field of Classification Search
CPC ...... H01J 37/32596; H01J 37/32825; H01J 37/32541; H01J 37/32532; H01J 37/32733; H01J 37/32752; H01J 37/32761; H01J 37/3277; H01L 21/02087
USPC ........... 118/723 E, 723 ER, 718; 156/345.43, 156/345.44, 345.45, 345.46, 345.47
See application file for complete search history.

(56) References Cited

U.S. PATENT DOCUMENTS

| 3,674,667 A | 7/1972 | Manion et al. |
| 4,479,369 A | 10/1984 | Sando et al. |
| 4,550,578 A | 11/1985 | Sando et al. |
| 5,013,579 A | 5/1991 | Yamazaki |
| 5,041,304 A | 8/1991 | Kusano et al. |
| 5,065,600 A | 11/1991 | Byles |

(Continued)

FOREIGN PATENT DOCUMENTS

| JP | 45-6433 | 3/1970 |
| JP | 10087857 | 4/1998 |

(Continued)

OTHER PUBLICATIONS

T. Stegmaier et al., Plasma Technologies for Textiles, ed. R. Shishoo, Woodhead Publishing, 207, p. 125-157.

(Continued)

*Primary Examiner* — Sylvia R MacArthur
*Assistant Examiner* — Anna Crowell
(74) *Attorney, Agent, or Firm* — Samuel M. Freund; Cochran Freund & Young LLC

(57) ABSTRACT

An arcless, atmospheric-pressure plasma generating apparatus capable of producing a large-area, temperature-controlled, stable discharge at power densities between about 0.1 W/cm$^3$ and about 200 W/cm$^3$, while having an operating gas temperature of less than 50° C., for processing materials outside of the discharge, is described. The apparatus produces active chemical species, including gaseous metastables and radicals which may be used for polymerization (either free radical-induced or through dehydrogenation-based polymerization), surface cleaning and modification, etching, adhesion promotion, and sterilization, as examples. The invention may include either a cooled rf-driven electrode or a cooled ground electrode, or two cooled electrodes, wherein active components of the plasma may be directed out of the plasma and onto an external workpiece without simultaneously exposing a material to the electrical influence or ionic components of the plasma.

9 Claims, 6 Drawing Sheets

(56) References Cited

U.S. PATENT DOCUMENTS

| | | | |
|---|---|---|---|
| 5,286,532 A * | 2/1994 | Yoshikawa et al. | 427/536 |
| 5,312,667 A | 5/1994 | Lumb et al. | |
| 5,376,413 A | 12/1994 | Callebert et al. | |
| 5,425,832 A | 6/1995 | Kusano et al. | |
| 5,597,456 A | 1/1997 | Maruyama et al. | |
| 5,604,038 A | 2/1997 | Denes et al. | |
| 5,961,772 A | 10/1999 | Selwyn | |
| 6,072,273 A | 6/2000 | Schoenbach et al. | |
| 6,106,659 A | 8/2000 | Spence et al. | |
| 6,151,928 A | 11/2000 | Anyon et al. | |
| 6,187,391 B1 | 2/2001 | Kataoka et al. | |
| 6,189,485 B1 | 2/2001 | Matsuda et al. | |
| 6,228,330 B1 | 5/2001 | Herrmann et al. | |
| 6,262,253 B1 | 7/2001 | Russell-Jones et al. | |
| 6,346,770 B1 | 2/2002 | Schoenbach et al. | |
| 6,525,127 B1 | 2/2003 | Jariwala et al. | |
| 6,649,222 B1 | 11/2003 | D'Agostino et al. | |
| 6,774,018 B2 | 8/2004 | Mikhael et al. | |
| 6,818,253 B2 | 11/2004 | Kimbrell | |
| 6,830,652 B1 | 12/2004 | Ohmi et al. | |
| 6,903,512 B2 * | 6/2005 | Ohta et al. | 315/169.1 |
| 6,955,999 B1 | 10/2005 | Boye | |
| 7,044,078 B2 * | 5/2006 | Fukuda et al. | 118/723 E |
| 7,049,379 B2 | 5/2006 | Jariwala et al. | |
| 2001/0031543 A1 | 10/2001 | Ando et al. | |
| 2002/0129902 A1 | 9/2002 | Babayan et al. | |
| 2003/0072891 A1 * | 4/2003 | Murakami et al. | 427/569 |
| 2003/0145389 A1 | 8/2003 | Chen et al. | |
| 2004/0137647 A1 | 7/2004 | Miyazaki et al. | |
| 2004/0152381 A1 | 8/2004 | York et al. | |
| 2004/0187783 A1 * | 9/2004 | Maeda et al. | 118/718 |
| 2004/0194223 A1 | 10/2004 | Cernak | |
| 2004/0213918 A1 | 10/2004 | Mikhael et al. | |
| 2005/0229327 A1 | 10/2005 | Casella et al. | |
| 2007/0137573 A1 | 6/2007 | Kholodenko et al. | |

FOREIGN PATENT DOCUMENTS

| | | | |
|---|---|---|---|
| JP | 2000353698 A | * | 12/2000 |
| JP | 2002339075 A | * | 11/2002 |
| JP | 2003201570 A | * | 7/2003 |
| WO | 9858117 | | 12/1998 |

OTHER PUBLICATIONS

Selwyn, Gary S., U.S. Appl. No. 11/556,130, filed Nov. 2, 2006, "Treatment of Fibrous Materials Using Atmospheric Pressure Plasma Polymerization".

Lieberman et al., Principles of Plasma Discharges and Materials Processing, John Wiley & Sons, Inc., 1994, p. 167-171.

Final Office Action, U.S. Appl. No. 11/317,374, pp. 1-7, Apr. 22, 2009.

Advisory Action, U.S. Appl. No. 11/317,374, pp. 1-9, Jul. 2, 2009.

International Search Report for PCT/US2007/82263, International Searching Authority, Mar. 31, 2008, pp. 1-10.

Thiry, Maria C. Do you Believe in Magic, AATCC Review (Apr. 2006), p. 21-26, US.

AATCC Commitee RA88. Standardization of Home Laundry Test Conditions, AATCC Technical Manual (2003), p. 402. US.

Non Final Office Action, U.S. Appl. No. 11/317,374, pp. 1-37, Nov. 21, 2008.

International Search Report for PCT/US2006/62040, International Searching Authority, Mar. 17, 2008, pp. 1-9.

Examiner's Answer, U.S. Appl. No. 11/317,374, pp. 1-17, Dec. 24, 2009.

Non Final Office Action, U.S. Appl. No. 11/556,130, pp. 1-31, Jan. 29, 2010.

International Search Report for PCT/US09/33144, International Searching Authority, Mar. 18, 2009, pp. 1-11.

* cited by examiner

LARGE AREA, ATMOSPHERIC PRESSURE PLASMA FOR DOWNSTREAM PROCESSING

RELATED CASES

The present patent application is a divisional application of U.S. patent application Ser. No. 12/029,386 filed on Feb. 11, 2008, and issued as U.S. Pat. No. 8,361,276 on Jan. 29, 2013, which application is hereby incorporated by reference herein for all that it discloses and teaches.

FIELD OF THE INVENTION

The present invention relates generally to apparatus and method for plasma processing of materials and, more particularly, to an atmospheric-pressure plasma generating apparatus capable of producing a temperature-controlled, stable discharge having a temperature of less than 50° C. for generation of active chemical species, including gas metastable and radical species effective for large area plasma processing, whereby active chemical or active physical components of the plasma exit the discharge and impinge on a substrate disposed externally to the discharge, without simultaneous exposure of the substrate to the electrical influence or ionic components of the plasma.

BACKGROUND OF THE INVENTION

The use of ionized gases (plasma) for treating, modifying and etching of material surfaces is well established. Both vacuum-based plasmas and those that operate at or near atmospheric pressure, have been used for surface modification of materials ranging from plastic wrap to non-woven materials and textiles, the plasma being used to provide an abundant source of active chemical species, which are formed inside the plasma, from the interaction between resident electrons in the plasma and neutral or other gas phase components of the plasma. Typically, the active species responsible for surface treatment processes have such short lifetimes that the substrate must be placed inside the plasma ("in-situ" processing). Thus, the substrate, and at least one stable "precursor" gas are present together inside a process chamber in contact with the plasma ranging in excitation frequencies from DC to microwave frequencies so that the short-lived active chemical species generated by the plasma are able to react with the substrate before decay mechanisms, such as recombination, neutralization or radiative emission can de-activate or inhibit the intended surface treatment reactions.

In addition to vacuum-based plasmas, there are a variety of plasmas that operate at or near atmospheric pressure. Included are dielectric barrier discharges (DBDs), which have a dielectric film or cover placed on one or both of the powered and ground electrodes (which may be planar or annular in design); corona discharges, which typically involve a wire or sharply-pointed electrode; micro-hollow discharges, which consist of a series of closely-packed hollow tubes that form either the rf or ground electrode and is used with a counter electrode to generate a plasma; a "flow-through" design, which consists of parallel-placed screen electrode and in which a plasma is generated by the passage of gas through the two or more screen electrodes; plasma jets in which a high gas fraction of helium is used along with electrical power in the 2 MHz-100 MHz range and a close electrode gap to form an arc-free, non-thermal plasma; and a plasma "torch", which uses an of an arc intentionally formed between two interposed electrodes to generate extremely high temperatures for applications such as sintering, ceramic formation and incineration.

The use of atmospheric pressure gases for generating a plasma provides a greatly simplified means of treatment for large or high volume substrates, such as plastics, textiles, non-wovens, carpet, and other large flexible or inflexible objects, such as aircraft wings and fuselage, ships, flooring, commercial structures. Treatment of these substrates using vacuum-based plasmas would be complicated, dangerous and prohibitively expensive. The present state of the art for plasmas operating at or near atmospheric pressure also limits the use of plasma for treatment of these commercially-important substrates.

Of the various atmospheric pressure plasmas, the Dielectric Barrier Discharge (DBD) is the most widely used, and is characterized by the use of a dielectric film or cover on one or both of the electrodes to prevent formation of a persistent arc that would otherwise form between the electrodes. By accumulating charge on the surface of the dielectric as an arc forms, this build-up of charge acts to quench the arc, which typically reforms elsewhere on the electrode. The substrate itself may function as the dielectric cover, provided that it fully covers the exposed electrode. In some situations, a high gas fraction (>50%) of helium is added to the process gas to help homogenize the discharge. DBDs have the advantage of having a large gap between the electrodes, so that a thick substrate can readily be placed on one of the electrodes. However, since electrical power must be transmitted through the dielectric cover, the power density that a DBD discharge can achieve is limited. Low power density typically produces slow processing, because low-power density in the plasma also results in a slow generation rate of the active, chemical species responsible for materials processing. The dielectric cover on the electrode also inhibits heat removal since most electrical insulators also function as thermal insulators. Because of this, the gas temperature inside a DBD can often reach temperatures as high as 100° C.-200° C. during prolonged plasma operation (See, e.g., T. Stegmaier et al. et al., *Plasma Technologies for Textiles*, ed. R. Shishoo, Woodhead Publishing, 2007, pg 140).

Corona discharges are also widely used for surface treatment and activation. In these discharges, a high electric field is generated in the vicinity of a wire or other electrode having sharply pointed edges. If the electric field is sufficient to remove electrons from neutral gas species, then ionization localized around the wire will result. Such plasmas are typically used for surface modification reactions, such as plastic food wrap. Again, slow processing speed and inability to cool the neutral gas temperature are characteristic of these discharges, and processing is limited to the treatment of dry, non-conductive substrates. There is no effective way to water-cool a wire electrode, because the means of plasma generation depends on the strong electric field created by a small radius of curvature.

Micro-hollow discharges, such as those described in U.S. Pat. No. 6,346,770 and U.S. Pat. No. 6,072,273 are characterized by series of micro-hollow openings in a conductive electrode that is typically covered with a dielectric layer. Each of the micro-hollow openings in the electrode has a cross-sectional area that is on the order of the mean free path of the electrons in the gas. Micro-hollow discharges are often operated at sub-ambient pressure, in the range of 0.1 to 200 Torr, but may also be operated at pressures approaching atmospheric pressure. The diameter of each opening in the electrode is in the range between 0.1 and 10 Torr-centimeters. For atmospheric pressure, this would equate to an opening having a diameter in the range of between 1.3 to 130 μm. The spacing between adjacent ground electrode tubes in this invention is preferably in the range of between 0.06 and 0.100 in. (1.5 mm to 2.54 mm) which, when multiplied by atmospheric pressure (760 Torr), equates to 114 to 193 Torr-cm, or more than 10× the guideline specified by the micro-hollow discharge. Further, the use of a dielectric cover on the electrode of the micro-hollow discharge reduces the ability to effectively cool the neutral gas temperature by water cooling of the electrodes, because thermal conduction is inhibited by the presence of the dielectric. Another problem for large area processing, is that the active treatment region is limited to the open area provided by each of the micro-hollow discharge elements.

The atmospheric-pressure plasma jet (APPJ) uses a process gas mixture consisting of >95% helium, electrical energy between 1 MHz and 100 MHz and a narrow gap between two conducting electrodes to achieve a stable, non-arcing plasma. The electrodes may be planar and parallel (U.S. Pat. No. 6,262,253), or annular in design (U.S. Pat. No. 5,961,772), but must have a uniform gap between the rf and ground electrodes. The use of helium gas mixtures with an electrode gap in the range of between 0.5 mm and 2.5 mm has been found to assist in the prevention of arcing when appropriate high frequencies are used to power the electrodes. Gas flow may be either along the longitudinal axis of the electrodes for the annular design, or may be along the planar axis for the parallel plate design. Certain substrates may be placed inside the discharge for treatment, provided the thickness of the substrate does not induce arcing, and the substrate does emit volatile gases that change the gas chemistry inside the discharge. The advantages of this design over other atmospheric pressure discharges are the ability to generate a large-area discharge having high-power density suitable for fast processing, and the ability to efficiently cool the neutral gas temperature since dielectric covers are not required, and since the use of solid metal electrodes permits internal water cooling to efficiently remove heat from the gases in the plasma.

An annular APPJ discharge apparatus where the gas was flowed between the rf and ground electrodes through a series of perforations in one of the uncooled electrodes has been used in a cleaning process (U.S. Pat. No. 6,228,330).

A flow-through electrode design using a gas flow consisting of predominately helium feed gas that flows through two metal screens that function as electrodes, one rf-powered and the other grounded is described in U.S. Patent Publication No. 2002/0129902. The discharge is created in the gap between the parallel, screen electrodes, which generally has the same spacing as the inter-electrode gap of the APPJ discharge. High gas flow rates through a large open area are required since the active chemical species must transit the distance between the point of creation in the plasma and the substrate which may be located several millimeters from the closest perforated electrode, thereby necessitating a fast linear flow rate. Further, the metal screen cannot be water-cooled, leading to a high, neutral gas temperature (>150° C.), especially if high rf power is used since heat removal is limited to conduction at the point of contact with the housing, and from the heat capacity of the gas as it exits the plasma.

A plasma torch is a thermal discharge characterized by generation of extremely high temperatures, often in excess of 10,000° C., which is destructive to substrates.

SUMMARY OF THE INVENTION

Accordingly, it is an object of the present invention to provide an atmospheric-pressure plasma generating apparatus effective for producing a large area, temperature-controlled, stable discharge.

Another object of the invention is to provide an atmospheric-pressure plasma generating apparatus effective for producing a large area, temperature-controlled, stable discharge at a power density of between about 0.1 W/cm$^3$ and about 200 W/cm$^3$.

Still another object of the present invention is to provide an atmospheric-pressure plasma generating apparatus having an operating, neutral gas temperature of less than 50° C.

Yet another object of the present invention is to provide an atmospheric-pressure plasma generating apparatus effective for generating active chemical species, including gas metastables and active physical components, wherein the active species of the plasma exit the discharge and impinge on a substrate disposed outside of the discharge without simultaneous exposure of the substrate to the electrical influence or ionic components of the plasma.

Additional objects, advantages and novel features of the invention will be set forth in part in the description which follows, and in part will become apparent to those skilled in the art upon examination of the following, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention, as embodied and broadly described herein, the atmospheric-pressure plasma discharge apparatus, hereof, includes in combination: a first electrode having a planar surface; a plurality of spaced-apart circular or oval parallel tubes forming a second planar electrode, each tube of the plurality of tubes having an outer surface spaced apart a first chosen distance from the surface of the first electrode, and a second chosen distance from the outer surface of an adjacent tube thereto; an rf power supply in electrical contact with either of the first electrode or with each tube of the plurality of tubes for providing rf power to the first electrode or to each tube of the plurality of tubes, the unpowered electrode of the first electrode or each tube of the plurality of tubes being placed in electrical contact with a ground electrical potential; means for cooling each tube of the plurality of tubes to a chosen temperature; and means for flowing a gas into the space between the first electrode and the second electrode and out of the space between the first electrode and the second electrode between the spaced-apart outer surfaces of each tube of the plurality of tubes; whereby an atmospheric pressure plasma is generated between the first electrode and the second electrode.

In another aspect of the present invention and in accordance with its objects and purposes, the apparatus for atmospheric-pressure plasma discharge processing of a material, hereof, includes in combination: a first electrode having a planar surface; a plurality of spaced-apart parallel tubes forming a second planar electrode, each tube of the plurality of tubes having an outer surface spaced apart a first chosen distance from the surface of the first electrode, and a second chosen distance from the outer surface of an adjacent tube thereto; an rf power supply in electrical contact with either of the first electrode or each tube of the plurality of tubes for providing rf power to the first electrode or to each tube of the plurality of tubes, the unpowered electrode of the first electrode or each tube of the plurality of tubes being placed in electrical contact with a ground electrical potential; means for cooling each tube of the plurality of tubes to a chosen temperature; means for flowing a gas into the space between the first electrode and the second electrode and out of the space between the first electrode and said second electrode between the spaced-apart outer surfaces of each tube of the plurality of tubes; and means for moving said material at a third chosen distance from and parallel to the second electrode on the opposite side thereof from the flat surface of the first electrode; whereby an atmospheric pressure plasma is generated between the first electrode and the second electrode.

In still another aspect of the invention and in accordance with its objects and purposes, the method for atmospheric-pressure plasma discharge processing of a material, hereof, includes the steps of: flowing a gas into the space between a first electrode having a planar surface and a plurality of spaced-apart, parallel tubes forming a second planar electrode, each tube in the plurality of tubes having an outer surface spaced apart a first chosen distance from the planar surface of the first electrode, the outer surface of each tube of the plurality of tubes further being spaced apart a second chosen distance from the outer surface of an adjacent tube thereto, and out of the space between the first electrode and the second electrode between the spaced-apart outer surfaces of each tube of the plurality of tubes; cooling each tube of the plurality of tubes; forming a plasma discharge between the first electrode and the second electrode, one of the first or each tube of the plurality of tubes of the second electrode being powered using an rf power supply, the unpowered electrode being placed in electrical connection with ground potential; and moving the material at a third chosen distance from and parallel to the second electrode on the other side thereof from the flat surface of the first electrode.

In yet another aspect of the invention and in accordance with its objects and purposes, the atmospheric-pressure plasma discharge apparatus, hereof, includes in combination: a first electrode having a cylindrical inner surface and a first axis of symmetry; a plurality of parallel tubes forming a second cylindrical electrode interior to the first electrode and having a second axis of symmetry co-axial with the first axis of symmetry, each tube of the plurality of tubes having an outer surface spaced apart a first chosen distance from the inner cylindrical surface of the first electrode, the outer surface of each tube of the plurality of tubes further being spaced apart a second chosen distance from the outer surface of an adjacent tube thereto; an rf power supply in electrical contact with either of the first electrode or each tube of the plurality of tubes for providing rf power to the first electrode or each tube of the plurality of tubes, the unpowered electrode of the first electrode or each tube of the plurality of tubes being placed in electrical contact with a ground electrical potential; means for cooling each tube of the plurality of tubes to a chosen temperature; and means for flowing a gas into the annular space between the first electrode and the second electrode and out of the annular space between the first electrode and the second electrode between the spaced-apart outer surfaces of each tube of the plurality of tubes; whereby an atmospheric pressure plasma is generated between the first electrode and the second electrode.

Benefits and advantages of the present invention include, but are not limited to, faster plasma processing speed (which results from higher plasma power density) with concurrent lower neutral gas temperature, thereby permitting heat-sensitive processes or substrates to be treated, and the absence of a requirement that the substrate be exposed to the electrical influence or ionic components of the plasma.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

Figure 1:
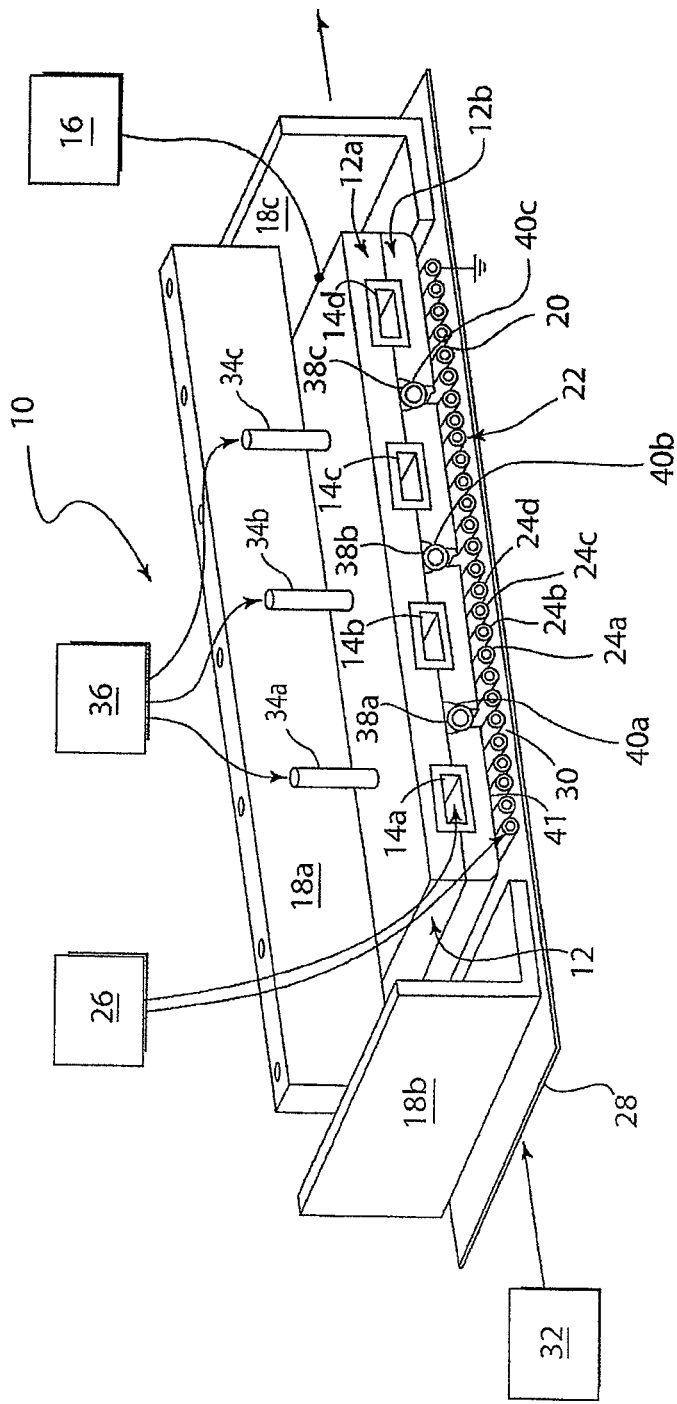
FIG. 1 is a schematic representation of a perspective view of one embodiment of plasma processing apparatus of the present invention illustrating an rf electrode having liquid cooling ducts, a plurality of tubular grounded electrodes adapted for liquid cooling, the gas inlet and distribution tubes, and the material to be processed disposed outside of the plasma near the ground electrode.

Briefly, the present invention includes an atmospheric-pressure plasma generating apparatus for producing a large area, non-thermal, stable discharge at power densities between about 0.1 W/cm$^3$ and 200 W/cm$^3$, but also capable of having a neutral gas temperature of at most 50° C. In what follows, the term "atmospheric pressure" means pressures between about 500 Torr and about 1000 Torr. The active chemical species or active physical species of the plasma exit the plasma discharge before impinging on a substrate disposed outside of the discharge, thereby permitting substrate surface processing, without simultaneous exposure of the substrate to the electric fields or ionic components of the plasma. As stated, the plasma has a neutral gas temperature of less than 50° C., even during prolonged and continuous operation, and species including gas metastables and radicals, as examples, may be generated. The high power densities, the lower operating plasma temperatures and the placement of the material to be processed exterior to the plasma, permit accelerated processing rates, and treatment of most substrates.

The present plasma source may be used for polymerization (either free radical-induced or through dehydrogenation-based polymerization), surface cleaning and modification, etching, adhesion promotion, and sterilization, as examples.

The present atmospheric pressure plasma generating apparatus includes effective means for water-cooling either or both electrodes and means for directing a fast flow of active species produced within the discharge volume, out of the discharge. Simply creating a thick, perforated electrode that can be water cooled, would be expensive to build and would likely be ineffective for the present purposes because the thickness of the electrode adds to the transit distance required for the active species, thereby increasing the opportunity for deactivation. The physical characteristics of the ground electrode and the use of gas chemistry such as trace addition of $NH_3$ or Ar, assist in the creation of longer lived, active species in the plasma that may be used for surface activation of materials or polymerization of monomers located several millimeters downstream from the plasma.

A fast flow of active chemical or physical species generated in the plasma exiting the plasma impacts the workpiece before these species are deactivated by collisions, thereby generating chemical and/or physical changes to the workpiece without exposure of the workpiece to the electrical field or charged components that are present inside the plasma. This effect is achieved by creating a "plasma protrusion" from the hollow cathode effect formed between parallel openings in the ground or If electrode and using these protrusions to assist in carrying active species further downstream from their point of generation. In the present situation, the hollow cathode effect is produced between the grounded, liquid-cooled tubular or oval electrodes that efficiently cool the electrode and through which the active species flow following generation inside the plasma. An advantage of using circular or oval tubes to form the ground electrode, as opposed to using a plurality of water-cooled rectangular or square electrodes having similar aspect ratios, is that the oval or round electrode configuration avoids sharp edges that would perturb and undesirably enhance the discharge in the vicinity of the edge, due to the locally-enhanced electrical field that would result from the relationship, $E=V/r$, where r is the radius of curvature of the edge, V is the applied, instantaneous voltage on the electrode, and E is the electric field. An enhanced electric field is likely to induce arcing. As stated hereinabove, this downstream processing approach also inhibits exposure of the workpiece to charged species formed inside the plasma because of rapid recombination of such species once they leave the plasma.

Reference will now be made in detail to the present embodiments of the invention, examples of which are illustrated in the accompanying drawings. In the Figures, similar structure will be identified using identical reference characters. Turning now to FIG. 1, a schematic representation of a perspective view of one embodiment of plasma processing apparatus, 10, is shown, illustrating rf electrode, 12, having liquid cooling ducts, 14a-14d, powered by rf power supply and rf matching network, 16, connected to electrode 12 using a copper or other metal ribbon (not shown in FIG. 1), and supported by insulating members, 18a-18c, which may be fabricated from fiberglass, G10/FR4 (McMaster-Carr), a phenolic resin, PTFE, glass or ceramic, as examples, whereby first chosen spacing, 20, between rf electrode 12 and planar ground electrode, 22, constructed using parallel, grounded, hollow circular or oval tubes, 24a-24d, is maintained. Electrical energy is supplied in a frequency range between about 1 MHz and about 100 MHz, the rf matching network being used to adjust for a load deviation from 50 Ohms in the apparatus. Chiller, 26, supplies liquid coolant to cooling ducts 14a-14d and to hollow tubes 24a-24d adapted for liquid cooling. Either rectangular or circular tubing may be used in place of cooling ducts 14a-14d. Material to be processed, 28, is disposed outside of the plasma in the proximity of ground electrode 22, and maintained spaced-apart therefrom at second chosen spacing, 30. Material 28 may be moved during processing using an appropriate moving apparatus, 32. Gas inlet tubes, 34a-34c, supplied by gas supply and manifold, 36, provide the appropriate gas mixture to gas distribution tubes, 38a-38c, nominally ⅜ in. O.D., there being at least one gas inlet tube 34a for each gas distribution tube 38a, as an example, to maintain approximately constant gas pressure across gas distribution tubes 38a-38c. Gas distribution tubes 38a-38c may be made from plastic, Teflon or metal, as examples. Clearly, additional inlet tubes 34 would be provided to accommodate wider rf electrodes 12. Gas distribution tubes, 38a-38c have holes (not shown in FIG. 1) spaced apart along the length thereof and facing grounded electrode 22, such that gas emerges through tapered channels, 40a-40c, opening out of bottom surface, 41, of rf electrode 12. Tapered channels 40a-40c hold gas distribution tubes 38a-38c firmly in place, and recessed from surface 41. Radiofrequency electrode 12 is shown to be divided into two opposing portions, 12a and 12b, such that the channels 14a-14d and 40a-40c may be readily machined and gas distribution tubes 38a-38c may be installed, and for cleaning and maintenance as needed during operation of discharge apparatus 10. The three gas distribution tubes 38a-38c shown in FIG. 1 may be separated at 2.5 in. intervals center-to-center, and recessed from face 41 by 0.125 in. In another embodiment of the invention, O-rings can be used to confine the cooling liquid to cooling ducts 14a-14c in opposing portions 12a and 12b if tubing is not employed. To prevent loss of process gas through the sides of apparatus 10, gas flow is blocked by sealing the space between the first and last of grounded tubes 24a-24d and insulating members 18b and 18c, such that the direction of gas flow is always through the opening between grounded tubes 24a-24d (not shown in FIG. 1).

Figure 2:
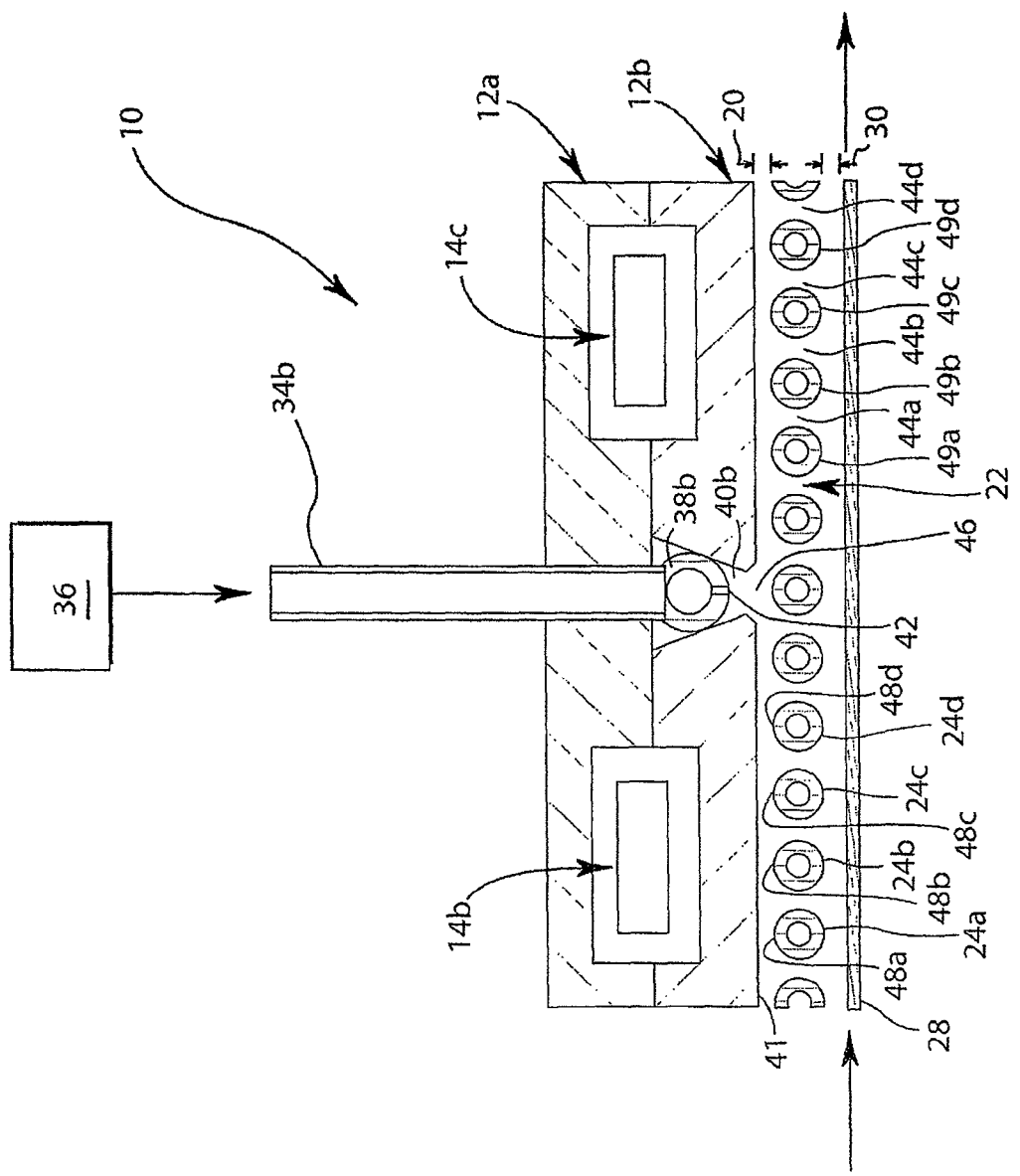
FIG. 2 is a schematic representation of a side view of the plasma processing apparatus shown in FIG. 1 hereof, illustrating a gas inlet tube port, the water cooling channels for the rf electrode, a recessed gas distribution tube, the plurality of tubular grounded electrodes, and the material to be processes disposed downstream of the plasma.

FIG. 2 is a schematic representation of a side view of plasma processing apparatus 10 hereof, illustrating gas supply tube 34b, water cooling channels 14b and 14c for rf electrode 12, recessed gas distribution tube 38b, tubular ground electrode 22, and material 28 disposed downstream of the plasma which is formed in first spacing 20. Shown also are radial holes, 42, which permit gas to flow out of gas distribution tube 38b, into tapered channel 40b, and out of surface 41 of rf electrode 12b. Holes 42 may be 0.03 in. in diameter. The gap between adjacent grounded electrode tubes 24a-24d may be between about 0.03 in. and 0.12 in. Two plasma discharge apparatus were tested: one having an electrode gap of about 0.12 in. and another having an electrode gap of about 0.093 in., the latter apparatus, having more grounded tubes for the same size of electrode 22, was found to give better results for the same flow conditions. The difference may be the result of a higher "downstream" gas flow velocity achieved with the smaller gap, and better gas cooling because of the increased area of the tubes.

Figure 3:
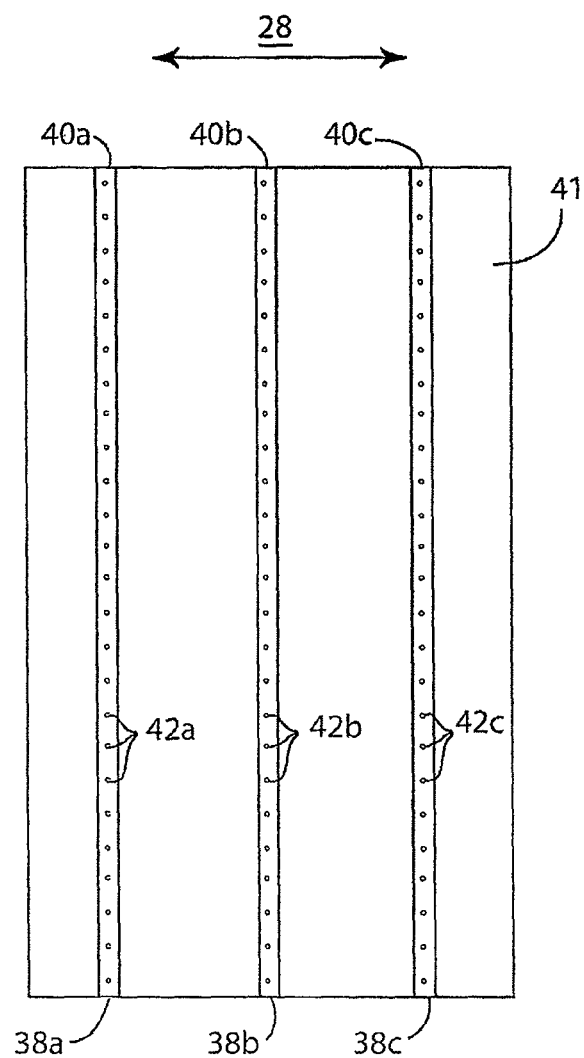
FIG. 3 is a schematic representation of an end-on view of the rf electrode shown in FIGS. 1 and 2 hereof, illustrating three, parallel recessed gas distribution tubes disposed normal to direction of motion of the material being processed.

FIG. 3 is a schematic representation of an end-on view of lower portion 12b of rf electrode 12, illustrating the three, parallel recessed gas distribution tubes 38a-38c recessed in channels 40a-40c (shown in FIGS. 1 and 2 hereof) in bottom surface 41 of rf electrode 12b, and disposed normal to direction of motion of substrate 28, shown in FIGS. 1 and 2 hereof.

Radial holes 42a-42c, facing substrate 28, are shown in gas distribution tubes 38a-38c, respectively, for providing a uniform gas distribution across surface 41. Relative locations of the radial holes 42a-42c are staggered with respect from each set (42a, 42b, 42c) to the other for better uniformity.

As stated hereinabove, effective cooling of the rf electrode may be achieved by sandwiching square copper or aluminum tubing 14a-14d between top and bottom sections 12a and 12b of rf electrode 12 which may also be made from aluminum, and flowing thermostatically-controlled, chilled water from chiller 26 which cools rf electrode 12 by conduction. Because neither rf electrode 12 nor grounded electrode 22 are covered with a dielectric material, thermal conduction between the electrodes and the gas is greatly enhanced, enabling effective and efficient gas cooling. Grounded electrode 22 includes a series of parallel, equally-spaced tubes, 24a-24c through which cooling water is also flowed utilizing chiller 26. Cooling ducts or tubes 14a-14d of rf electrode 12 and tubes 24a-24d could well be cooled by other fluids, such as a glycol-based coolant, or a chilled gas, as examples. Because of the high surface area provided by tubes 24a-24d of grounded electrode 22, gas cooling is enhanced relative to a water-cooled planar electrode. For tubes having ¼ in. outside diameter (O.D.), and a gap of about 0.09 in. open area between the tubes, the increase in surface area over a planar electrode is a factor of about 2.2. Thus, the downstream gas flow onto the substrate or workpiece may be effectively cooled. When oval-shaped ground electrode tubes 24a-24d are used, the short dimension of the tube is perpendicular to rf electrode 12 and the long dimension thereof is parallel to rf electrode 12.

Flowing gas is employed to generate the plasma and to carry active components produced in the plasma discharge between the rf and ground electrodes in spacing 20, out of the plasma through the spaces between the tubes, 44a-44d (FIG. 2), of grounded electrode 22, and onto workpiece 28. One gas mixture effective for this purpose includes between about 85% and about 100% helium flowing from gas supply 36 (FIGS. 1 and 2) into gas inlet tubes 34a-34c and into gas distribution tubes 38a-38c, also shown in FIGS. 1 and 2 hereof. Other gases may be added to the helium flow to enhance the formation of active species inside the plasma volume. Distribution tubes 38a-38c are fitted with small openings 42 to permit the gas to exit the distribution tubes from the side of the electrode facing the plasma. By placing these distribution tubes within gap or channel 40a-40c, respectively, machined into electrode 12, as best seen in FIG. 2, the distribution tubes are kept out of the active region of the plasma, as are the gas outlet openings. The channels do not permit plasma formation in immediate vicinity 46 (FIG. 2) thereof, because the inter-electrode gap between the rf and ground electrode is too large for a discharge to occur. The gas distribution tubes are disposed away from the discharge in order to prevent arcing events that occur due to an enhanced hollow cathode effect which may occur in small openings, in a similar manner to those in micro-hollow discharges. Three rows of gas distribution tubes have been found to be sufficient to achieve uniform processing for an rf electrode 12 that is 2 m×0.3 m, the longer dimension being parallel to distribution tubes 38a-38d, as shown in FIG. 3, and with the axis of the gas distribution tubes being perpendicular to the movement of material 28.

Figure 4:
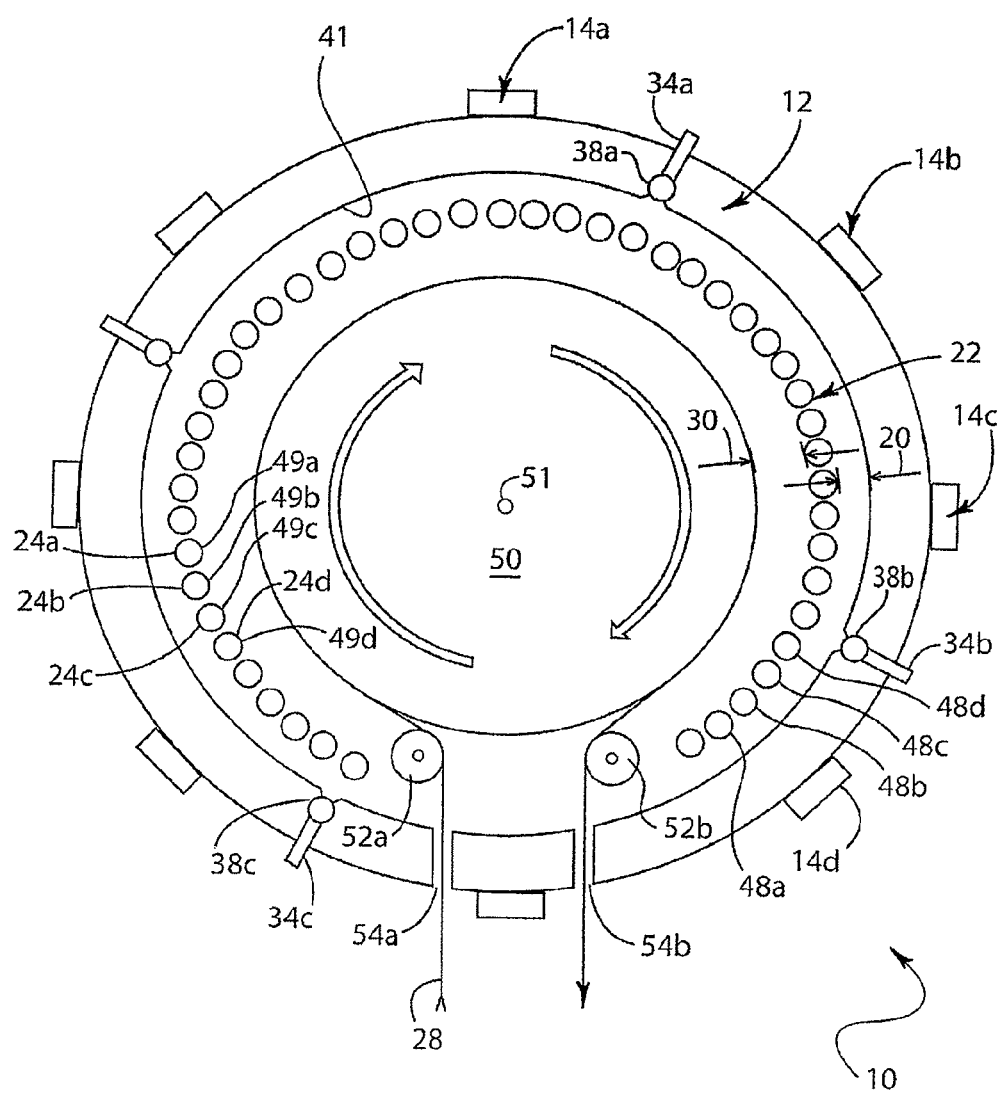
FIG. 4 is a schematic representation of an end-on view of an annular embodiment of the present invention illustrating a cylindrical rf electrode with liquid cooling channels, and a concentric grounded electrode interior thereto adapted for being liquid cooled (plurality of grounded parallel tubular electrodes), for generating an annular plasma therebetween; several recessed gas inlet and distribution tubes for introducing appropriate gases into the annular region between the rf and grounded electrodes; and a roller for directing a moving material to be processed through the reactive and excited species generated in the plasma, but "downstream" thereof.

FIG. 4 is a schematic representation of an end-on view of an annular embodiment of the present invention illustrating a cylindrical rf electrode 12 having water cooling channel or tubes 14a-14d attached to the outside of electrode 12 which designated to be the rf electrode for definiteness in what follows, although it may also serve as the ground electrode 22. Gas inlet tubes 34a-34c provide process gas to gas distribution tubes 38a-38d which span the axial length of the cylindrical electrode. Grounded electrode tubes 24a-24d, disposed parallel to one another and approximately coextensive with the length of the cylindrical electrode, may also be cooled by fluid flow, and are spaced between about 0.06 in. and about 0.12 in. separating the tube surfaces. The spacing 20 between the tube surfaces 48a-48d and surface 41 of rf electrode 12 may be between about 0.5 mm and about 3 mm. Material 28 may be exposed to the products of the plasma by being directed therethrough using rotating drum, 50, having an axis, 51, coaxial with the axis of rf electrode 12, and rollers, 52a and 52b, for bending the workpiece onto and off of main roller 50. The material may enter plasma processing apparatus 10 through open entry port, 54a, and exit the apparatus through open exit port, 54b. Process gas chemistry and power conditions may be the same as for the linear design shown in FIGS. 1-3 hereof. Drum 50, rollers 52a and 52b and entrance and exit ports 54a and 54b may be omitted if a generally cylindrical object, such as a human limb or a metal canister or roll, is inserted into the downstream gas flow from an open end of the apparatus for processing.

In operation, rf power is capacitively-coupled from rf power supply 16 to conductive electrode 12. It should be mentioned that either electrode may be rf-powered or grounded, but it is generally beneficial to power the electrode furthest from workpiece 28. Either one or both electrodes are cooled, the gas flow is initiated, thereby filling space 20 between rf electrode 12 and ground electrode 22 (also called the electrode gap) with process gas: between about 85% and about 100% of helium. Electrode gap 20 is typically between approximately 0.5 mm and approximately 3 mm, and is measured between the points 48a-48d of tubes 24a-24d closest to surface 41 of opposing electrode 12 and surface 41.

When electrode gap 20 is filled with gas and energized with radio frequency power between about 1 MHz and approximately 100 MHz, a plasma forms as stripes between the closest points 48a-48d of water-cooled tubes 24a-24d to surface 41 of if electrode 12 and surface 41. As the rf power is increased, the plasma extends into the spaces 44a-44d between the tubes, following the gas flow, and forms a "hollow cathode" effect, in which a faint, afterglow plume can be seen extending outward between the gap of the tubes. The hollow cathode effect assists in the transport of active species produced by the plasma across the thickness of the tubular electrodes since a weak plasma is generated inside the spaces between the tubes, effectively extending the plasma into this gap and slightly outside of it, on the side of the tubes away from the plasma. The glow discharge ignites in the inter-electrode volume, except in recessed space 46 adapted to hold the gas distribution tubes. As stated hereinabove, it is beneficial to avoid a discharge in this region to prevent damage to the gas distribution tubes and to prevent formation of a locally-enhanced discharge inside the gas openings in the gas distribution tubes.

As also stated, when the discharge is maintained, active species from the plasma will be carried through the narrow openings between the tubes and will impact workpiece 28. Workpiece 28 may be located anywhere from about 0 mm to about 10 mm from the closest surface, 49a-49d, of grounded electrode tubes 24a-24d. As stated hereinabove, gas flow from the plasma is prevented from exiting the plasma region except through the narrow space between the tubes. Even though significant electrical power (between about 10 W/cm$^3$ and occasionally greater than about 100 W/cm$^3$) is deposited into the plasma, which adds thermal energy to the process gas, efficient gas cooling effected by the water cooling system and the absence of thermal insulators (such as electrical dielectric covers) on the tubes and the rf electrode keep the gas temperature low. This may be significant when the present plasma discharge apparatus is used for surface polymerization of thin-film monomers since brief exposure to a hot gas will cause condensed monomer on the workpiece to rapidly vaporize and escape from the system. Similar considerations obtain for sterilization and medical applications where gas temperatures are generally kept below 25° C.

Material 28 may be moved perpendicular to the parallel alignment of the grounded electrode tubes, which provides a uniform, surface treatment because all areas of the surface are exposed to the gas flow. The gap between the material and the bottom of the tubes can also be controlled and varied. This gap is typically between about 0.5 mm and about 10 mm. A large gap enables the apparatus to polymerize monomer applied to the yarn of porous, thick substrates, such as deep-piled carpet, but also has the disadvantage that some of the active chemical species flowing out the plasma will recombine, or deactivate by other time-dependent means (such as by radiation or collisions), leading to slower processing. A small gap between the material and the tubes has the advantage of minimal deactivation of active species, but also is more prone to contaminating the plasma volume between the if and ground electrodes by mixing of any volatile vapors from the material with the process gases. The ability to treat materials that may emit vapors from other processing steps, is a significant advantage of the present invention since treatment of such materials using any of the in-situ processing methods would result in contamination of the process gas by the emitted volatile vapor, or would require such high gas flow as to be prohibitive in cost. Close-spacing of the tubes also allows the plasma gas to exit towards the material at a higher velocity, because the gas flow is directed through a smaller space, which increases the linear velocity of the gas, but without a concomitant increase in gas consumption, and thereby operating cost.

If the workpiece or material were to be held static in the apparatus, the result would be stripes of treatment, each stripe corresponding to a gap between the grounded electrode tubes 24a-24d. By moving the workpiece across the apparatus in a uniform manner and in a direction normal to the ground electrodes, uniform surface processing has been achieved. This provides for continuous treatment of a material, either in an in-line process or a stand-alone batch process. Workpiece or material 28 may include flexible materials such as textiles, carpet, plastics, paper, metal films, and non-wovens, as examples, or rigid materials, such as glass, silicon wafers, metal and metal sheeting, wood, composite materials, cardboard, surgical instruments or skin, as examples. The workpiece may be a laminar material. The material may be moved using a conveyor belt, moving stage, or through other means of locomotion. Because the workpiece is outside of the plasma and the electrical fields therein, movement thereof is not complicated. The distance between the workpiece and the exit of the plasma-generated species between grounded electrode tubes 24a-24d is adjusted such that the deactivation or decay of the active species has not destroyed the chemical reactivity of the gas stream in the downstream region. Placement and movement of the workpiece between about 0 mm and about 10 mm from the surface of grounded electrode tubes 24a-24d, may satisfy this condition, depending on the process chemistry.

In surgical or cosmetic applications, such as facial peels or sterilization, apparatus 10 might be moved along the skin, allowing the active chemistry generated by the plasma to remove (by oxidation) the top layer of skin. For such procedures, an oxygen/helium feedgas chemistry might be employed, with a preferred mixture of about 1% oxygen in He. This gas mixture might also be employed for sterilization purposes and wound cleaning applications.

In summary, stable, non-arcing operation of the plasma requires three conditions to be satisfied: (a) a flow of a process gas consisting of between about 85% and about 100% helium; (b) rf excitation of one electrode in the frequency range of between about 1 MHz and about 100 MHz with bare metal electrodes exposed to the plasma; and (c) a gap between the rf-driven electrode and the ground electrode that is between approximately 0.5 mm and approximately 3 mm. It has been experimentally determined that good results are obtained at a spacing of about 1.6 mm when an rf frequency of about 13.56 MHz is employed (and at slightly smaller distances for higher frequencies). Additionally, low-temperature operation (that is, between about 0° C. and about 35° C.) requires efficient cooling of both electrodes using a temperature-controlled fluid, such as chilled air, ethylene glycol or distilled water, as examples. The use of conductive fluids, such as brine, is undesirable because of the corrosive effect of the brine as well as the electrical leakage of radiofrequency power that may result.

Vapor-condensation used to apply between an approximately 10 nm and an approximately 50 nm thickness of condensed perfluoroacrylate monomer to a fibrous substrate, as described in U.S. patent application Ser. No. 11/556,130, filed on Nov. 2, 2006, for "Treatment Of Fibrous Material Using Atmospheric Pressure Plasma Polymerization" by Gary S. Selwyn, the teachings of which are hereby incorporated by reference herein, can also be utilized in the present invention. Perfluoroacrylate monomer vapor entrained in a flow of inert or unreactive gas is directed into a heated applicator having a narrow slit or orifice opening to allow the gas stream and vapor to uniformly exit in the vicinity of a workpiece. Because the workpiece is at or below room temperature, as the material is moved past the applicator, a thin film of monomer or other chemical that is reactive to the plasma is uniformly condensed on the surface of the workpiece. The polymerization or activation of this condensed film may be achieved by exposure of the film to active chemical species created by the plasma and entrained in the gas stream exiting the plasma in accordance with the teachings of the present invention. The species exit the present apparatus through the narrow openings between the grounded electrode tubes and impinge on the condensed monomer, thereby rapidly polymerizing the monomer. The monomer is not exposed either to the plasma or to high-temperature chemical species. As described in EXAMPLE 3 hereinbelow, polymethylmethacrylate (PMMA) films on heat-sensitive substrates, such as polypropylene, have been made in this manner.

Associated with the vapor condensation procedure, it has been observed by the present inventor that the amount of open area of the plasma that is exposed to the workpiece (as an example, by a screen electrode) is inversely related to the efficacy of the process. That is, a grounded screen electrode, having open area of 60%, provides slow (tens of seconds) downstream polymerization of condensed monomer before the un-cooled screen electrode is heated by the plasma. This configuration was unable to be used for a continuously operating process because as the electrode screen (not water-cooled) heated up, the increasing neutral gas temperature caused the thinly condensed film to evaporate before it was able to be polymerized. This did not happen when the apparatus shown in FIGS. 1 and 2 hereof was used to generate the plasma. Applying the same conditions for two different tubular, water-cooled ground electrode of the present invention, and comparing the time required for monomer polymerization, shows that a 0.12 in. gap between tubes provides 28.8% open area of the plasma, but results in a polymerization rate that is about 25% slower than a 0.09 in. gap between tubes, having only 23.4% open area. The faster polymerization rate of the smaller gap may be attributed to the higher linear gas flow resulting from a smaller opening. There is also an enhancement from the hollow cathode effect that causes a glow to form between the tubes, if the gap is adjusted to an optimal spacing.

It is possible to directly view the discharge as it emanates through the ground electrode tubes, by placing a clear, plastic film over the ground electrode tubes and by confining the film to the reactor assembly. For a tube spacing of 0.090" and at a low power condition of 300 W in a 12 in.×5 in.×0.070" discharge=71.4 W/in.$^3$ or 4.3 W/cm$^3$, there is a thin sheath seen on each side of the ground electrode tubes and a bright glow region immediately towards the center of the space of that sheath. At a higher power condition of 1200 W under the same conditions, providing a power density of 285 W/in$^3$=17.2 W/cm$^3$, the sheaths merge together and form an enhanced central glow in the middle of the gap, which provides improved discharge efficiency when a downstream discharge is employed, and indicates that a gap spacing of between about 0.070 in. and about 0.090 in. provides an efficient discharge for these power conditions. It is known that increased power applied to a collisional sheath causes an increase in the sheath thickness because of the decrease in the electron Debye length that occurs for greater electron densities (See, e.g., M. A. Lieberman and A. J. Lichtenberg, *Principles of Plasma Discharges and Materials Processing*, John Wiley & Sons, 1994, pg. 170-171).

Having generally described the invention, the following EXAMPLES provide additional details. Except in EXAMPLE 3 hereof, double-knit, 100% polyester, stretch performance sports apparel was chosen for the EXAMPLES because this fabric stretches easily and has a loose knit which often causes arcing to occur when processed in-situ. By processing this material downstream, in accordance with the teachings of the present invention, arcing to the fabric is avoided. EXAMPLE 3 was performed using a 0.05 mm thick, continuous polymeric film of polypropylene, such as the clear, plastic film commonly used in food packaging applications.

Example 1

Figure 5:
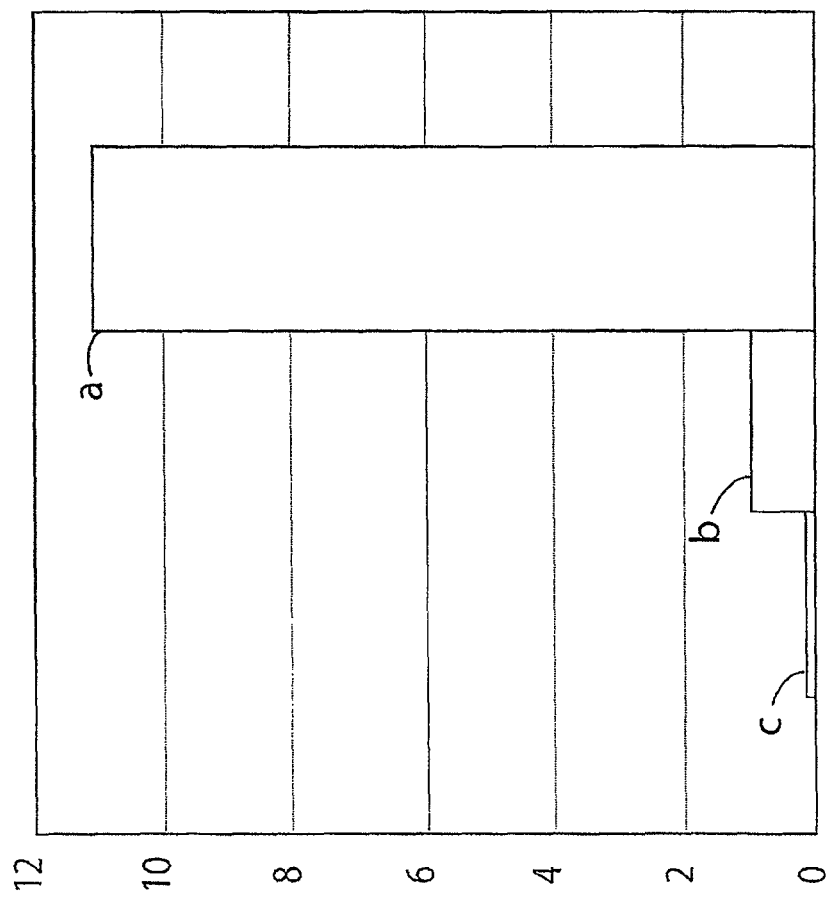
FIG. 5 is a graph of measured water repellency calibrated against the 3M scale for polyester knitted fabric treated using the downstream plasma apparatus shown in FIG. 1 hereof for affecting a polymerization process on the surface of the fabric, as a function of selected plasma gas, where the fabric is disposed 5 mm from the ground electrode, wherein bar (a) illustrates the results for a process gas comprising He+0.01 slpm of ammonia; bar (b) illustrates the results for He+0.2 slpm of argon; and bar (c) illustrates the results for He only.

A polyester fabric having a thickness of 0.7 mm. was mounted on a movable, temperature-controlled stage, the temperature set at 15° C., and the fabric plasma-treated for water and oil repellence (hydrophobicity and oleophobicity) in accordance with the teachings of the Ser. No. 11/556,130 patent application, supra. The gap between the applicator and the stage was 3.5 mm; the gap between the planar rf electrode and the top of the ground electrode was 2.0 mm; the grounded, water-cooled, parallel, aluminum tubes, ¼ in. O.D. had a spacing between the tubes of 0.09 in.; and the gap between the bottom of the ground electrode and the stage was 5.2 mm. The argon flow into the evaporator/applicator was 0.3 slpm, and the chemical feed rate of perfluorooctylacrylate-based monomer (Daikin TG-10) was 0.6 ml/min. The temperature of the evaporator was 170° C. and that for the applicator was 180° C. The plasma was operated at 650 W at 13.56 MHz using a constant flow of 40 slpm of He, to which either no other gas was added, or small amounts of Ar or anhydrous NH$_3$ gas were added, at flow rates of 0.2 slpm or 0.01 slpm, respectively. The stage speed was 3.3 yd/min. and the fabric was exposed to one loading of monomer immediately followed a single plasma pass. Initial test results were quantified using the 2003 3M Water Repellency Test III: Water/Alcohol Drop Test (3M Protective Materials and Consumer Specialties Div., publication 98-0212-0986-5), where a drop of the test liquids are placed on the fabric and whether the drop wets into the fabric within 10 s of application is determined. The ratings are an average of the highest scores successfully achieved at several different points on the substrate. The results are shown in FIG. 5 for three different gas compositions used to generate the plasma. FIG. 5 is a bar graph showing the hydrophobic treatment results for 3 different plasma conditions, for a spacing of 5.2 mm from the ground electrode to the substrate: bar (a) illustrating the results for a process gas comprising He+0.01 slpm of ammonia; bar (b) illustrating the results for He+0.2 slpm of argon; and bar (c) illustrating the results for He only. The helium gas flow in all cases was 40 slpm.

The compositions of the test liquids are shown in the TABLE.

TABLE

3M Water Repellency Test II:

| Test Liquid | Percent Composition of Liquids by Volume | Surface Tension, Dynes/cm at 25° C. |
|---|---|---|
| 0 | 100% de-ionized water (DI water) | >72.8 |
| 1 | 98/2 DI water/Isopropyl alcohol (IPA) | 58 |
| 2 | 95/5 DI water/IPA | 50 |
| 3 | 90/10 DI water/IPA | 41 |
| 4 | 80/20 DI water/IPA | 33 |
| 5 | 70/30 DI water/IPA | 28.4 |
| 6 | 60/40 DI water/IPA | 26.2 |
| 7 | 50/50 DI water/IPA | 25.8 |
| 8 | 40/60 DI water/IPA | 24.5 |
| 9 | 30/70 DI water/IPA | 24 |
| 10 | 20/80 DI water/IPA | 23.3 |
| 11 | 10/90 DI water/IPA | 22.7 |
| 12 | 100% IPA | 21.5 |

A test result of zero indicates no polymerization has occurred. The results demonstrate the longer transit distance of free radicals responsible for the polymerization process, when there is trace addition of Ar or NH$_3$ to the plasma, by the greater polymerization that occurs at this large gap between the tubular grounded electrodes and the substrate.

Example 2

A similar sample to that described in EXAMPLE 1 hereof was mounted on a movable, temperature-controlled stage, the temperature set at 15° C., and plasma-treated for water and oil repellence (hydrophobicity and oleophobicity) in accordance with the teachings of the Ser. No. 11/556,130 patent application, supra. The distance between the applicator and the stage surface to which the fabric was mounted was 3.5 mm; the gaps between the planar rf electrode and the tops of the ¼ in. O.D. tubular, aluminum grounded electrodes were 2.0 mm; and the gap between the bottom of the tubular ground electrode and the stage was 2.5 mm. The argon flow through the evaporator/applicator was 0.3 slpm; the total flow through the three gas distribution tubes connected to the 12 in.×5 in. rf electrode was comprised of 40 slpm He+0.04 slpm of NH$_3$; the applied rf power was 700 W at 13.56 MHz. The stage speed was 3.3 yd/min., and a perfluorooctylacrylate-based monomer (Daikin TG-10) was applied at a flow rate of 0.4 ml/min. The temperature of the evaporator was 170° C. and that for the applicator was 180° C. The fabric was treated by condensing a thin film of fluorocarbon-based monomer to the fabric, immediately followed by 8 passes through the plasma and then the process was repeated.

Figure 6:
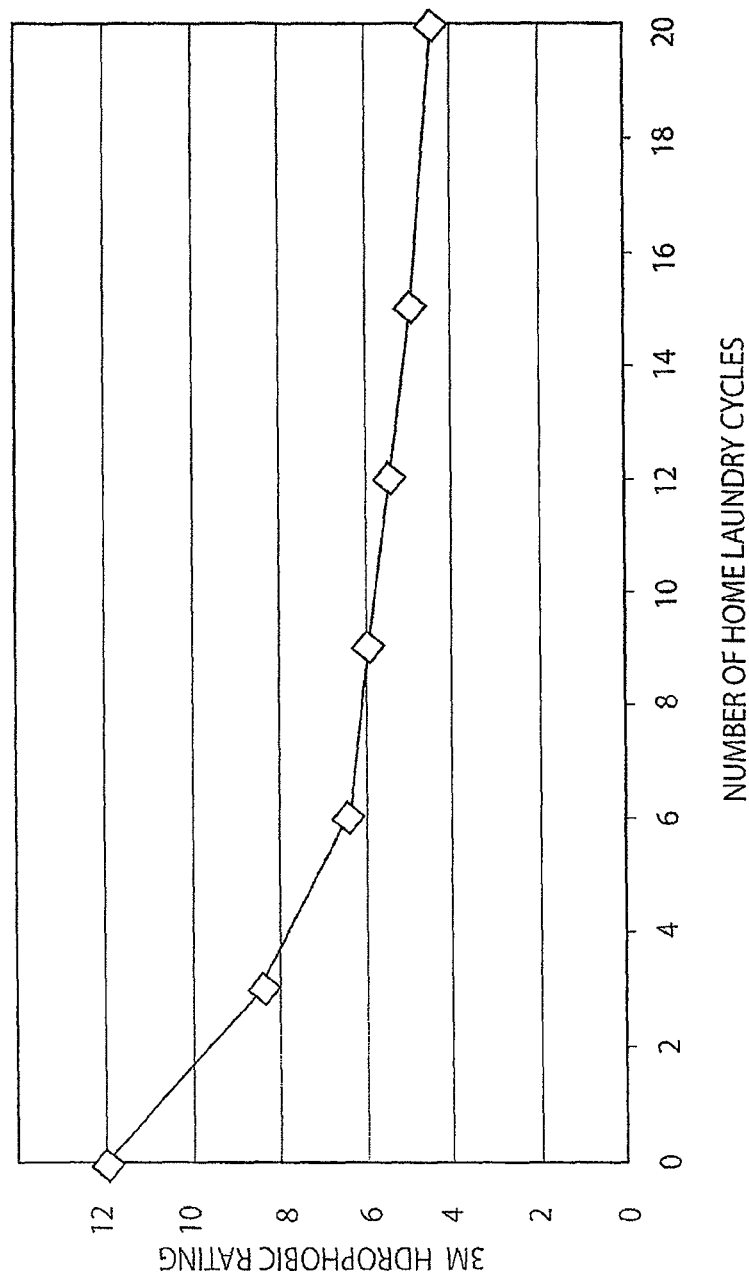
FIG. 6 is a graph of measured water repellency calibrated against the 3M hydrophobic scale for polyester knitted fabric treated using the downstream plasma apparatus shown in FIG. 1 hereof for affecting a polymerization process on the surface of the fabric, as a function of the number of home laundry cleaning cycles (water-based, detergent washing plus drying).

The polymerized monomer applied to the fabric provided an initial, maximum "12" rating on the 3M standard as described in the TABLE hereinabove. As illustrated in the TABLE, a "12" indicates a surface free energy of <21.5 dynes/cm, whereas a "3" indicates a surface free energy of <41 dynes/cm, but is >33 dynes/cm. This is indicated by whether a droplet of liquid having this surface tension (as achieved by mixtures of isopropyl alcohol and water) will either "bead-up" or wet the surface. The fabric was hydrophilic prior to treatment; that is, it absorbed distilled water). The fabric was then tested for durability against sequential home laundry cycles, with the results shown in FIG. 6. An average of several data points were taken for each sample tested. The results show acceptable durability for at least 20 laundry cycles, as a minimal rating of "3" is typically required for a stain-repellant finish.

Example 3

A transparent, 0.05 mm thick polypropylene film was mounted on a movable, temperature-controlled stage, the temperature set at 15° C., and a thinly-condensed film of liquid methylmethacrylate (MMA) monomer was applied to the surface facing the downstream plasma at a flow rate of 0.4 ml/min., in accordance with the teachings of the U.S. patent application Ser. No. 11/556,130, supra. The argon flowrate through the evaporator/applicator was 0.3 slpm, the distance between the applicator and the stage surface to which the film was mounted was 3.0 mm, the temperature of the evaporator was 95° C., and that for the applicator was 100° C.

In the plasma discharge apparatus of the present invention, both the gaps between the planar rf electrode and the closest locations of the surfaces of the ¼ in. O.D. tubular, aluminum grounded electrodes thereto, and the spacings between the surfaces of the tubular electrodes were 2.0 mm; and the gaps between the closest locations of the surfaces of the tubular grounded electrodes and the stage was 2.5 mm. The total flow through the three gas distribution tubes connected to the 12 in.×5 in. rf electrode comprised of 40 slpm He+0.04 slpm of $NH_3$; the applied rf power was 800 W at 13.56 MHz.

After the polymer film was treated by condensing the thin film of MMA monomer onto the film, the treated film was passed through the plasma at a stage speed of 3.3 yd/min., two times, and the sequence of coating the film with monomer and plasma treating the coated film was repeated 4 times.

Analysis of the polymethylmethacrylate (PMMA) film by optical ellipsometry indicated that the film had an index of refraction of 1.51, and a thickness of between 11 nm and 30 nm. The index of refraction for PMMA achieved through conventional (thermal) polymerization of MMA is between 1.49 and 1.51. Adhesion of the PMMA film to the polypropylene film was excellent. Efforts to achieve the described plasma polymerization using MMA and an in-situ process approach were unsuccessful because of the rapid evaporation of MMA when exposed to an ionized environment. Further, other downstream plasma methods were unsuccessful because of the heat content of the neutral gas exiting the plasma caused rapid evaporation of the MMA film prior to polymerization since MMA has a boiling point of 98° C. PMMA-coated polypropylene films are desirable for use for packing applications because of the luster and vapor barrier this coating provides.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An atmospheric-pressure plasma discharge apparatus comprising in combination:
   a first electrode having a cylindrical inner surface and a first axis of symmetry;
   a plurality of parallel tubes forming a second cylindrical electrode interior to said first electrode and having a second axis of symmetry co-axial with the first axis of symmetry, each tube of said plurality of tubes having an outer surface spaced apart a first chosen distance from the inner cylindrical surface of said first electrode, the outer surface of each tube of said plurality of tubes further being spaced apart a second chosen distance from the outer surface of an adjacent tube thereto;
   an rf power supply in electrical contact with either of said first electrode or each tube of said plurality of tubes for providing rf power to said first electrode or said second electrode, the unpowered electrode of said first electrode or each tube of said plurality of tubes being placed in electrical contact with a ground electrical potential;
   means for cooling each tube of said plurality of tubes to a chosen temperature; and
   means for flowing a gas into the annular space between said first electrode and said second electrode and out of the annular space between said first electrode and said second electrode between the spaced-apart outer surfaces of each tube of said plurality of tubes;
   whereby an atmospheric pressure plasma is generated between said first electrode and said second electrode.

2. The plasma discharge apparatus of claim 1, wherein a hollow cathode effect is produced between the spaced-apart outer surfaces of adjacent tubes of said plurality of tubes.

3. The plasma discharge apparatus of claim 1, wherein each tube of said plurality of tubes is placed in electrical contact with a ground electrical potential.

4. The plasma discharge apparatus of claim 1, wherein each tube of said plurality of tubes has a circular or oval cross section.

5. The plasma discharge apparatus of claim 1, wherein the gas flows through the surface of said first electrode before entering the space between said first electrode and said second electrode.

6. The plasma discharge apparatus of claim 5, wherein at least one open channel is provided in the surface of said first electrode out of which the gas exits the inner surface of said first electrode, dimensions of the at least one open channel being chosen such that no electric discharge takes place in the region of the at least one open channel and said second electrode.

7. The plasma discharge apparatus of claim 1, wherein means are provided for cooling said first electrode to a chosen temperature such that the gas temperature is less than 50° C.

8. The plasma discharge apparatus of claim 1, wherein the gas comprises between approximately 85% and approximately 100% of helium.

9. The plasma discharge apparatus of claim 1, further comprising means for moving a material at a third chosen distance from and concentric with said second electrode on the opposite side thereto from the inner surface of said first electrode.

* * * * *